United States Patent [19]
Walter et al.

[11] Patent Number: 4,475,780
[45] Date of Patent: Oct. 9, 1984

[54] COMPLIANT ELECTRICAL CONNECTOR

[75] Inventors: Leo Walter, Palos Verdes Peninsula; Helmut W. Greul, Rolling Hills Estates, both of Calif.

[73] Assignee: Buckbee-Mears Company, St. Paul, Minn.

[21] Appl. No.: 369,170

[22] Filed: Apr. 16, 1982

[51] Int. Cl.[3] .......... H05K 1/04

[52] U.S. Cl. .......... 339/17 C; 339/220 R; 339/221 R

[58] Field of Search .......... 339/220 R, 221 R, 221 M, 339/17 C

[56] References Cited

U.S. PATENT DOCUMENTS

| | | | |
|---|---|---|---|
| 3,566,343 | 2/1971 | Kinkaid | 339/221 R |
| 3,824,554 | 7/1974 | Shoholm | 339/221 R |
| 3,827,004 | 7/1974 | Vanden et al. . | |
| 3,907,400 | 9/1975 | Dennis | 339/221 R |
| 3,975,078 | 8/1976 | Ammon . | |
| 4,017,143 | 4/1977 | Knowles . | |
| 4,223,970 | 9/1980 | Walter | 339/220 R |

FOREIGN PATENT DOCUMENTS

| | | | |
|---|---|---|---|
| 2435461 | 2/1975 | Fed. Rep. of Germany | 339/221 R |
| 2525640 | 1/1976 | Fed. Rep. of Germany | 339/221 R |

*Primary Examiner*—William R. Briggs
*Attorney, Agent, or Firm*—William W. Haefliger

[57] ABSTRACT

A compliant electrical connector has a pin with opposed convex surfaces to grip the boundary of a hole, the pin having at least one groove sunk in the side thereof so that the pin forms a flexure that flexes to reduce the cross sectional area of the groove as the pin is inserted into the hole.

14 Claims, 8 Drawing Figures

COMPLIANT ELECTRICAL CONNECTOR

BACKGROUND OF THE INVENTION

This invention relates generally to the joining of electrical contacts or connectors to circuit boards, and more particularly concerns the construction of such contacts or connection to provide compliance or selfadjustment giving intimate contact with plating at a hole through the board, and enhancing reliability.

In the early days of computers, logic wiring was constantly changed, and thus the computer was "programmed" by plug-in wires called "patch cords", patching one component to another. These patch cords were located at the back or "back plane" of the computer. As transistors have advanced, and developed into a plurality of switches (gates, as they are called), logic is programmed into the computer by opening or closing said switches and gates. In this way, actual wiring is not physically disturbed. Subsequently, printed wiring boards carried the logic and memory components, with said wiring boards pluggable into "edge card connectors." Mounted on a "backplane", this is the same technology used to this day. However, the "backplane" still employs a plurality of posts, emanating from the back sides of the edge card connectors. These posts are wired by wire wrapping methods to program the computer, during manufacture. Program changes, and new programs are made by transistor switching. Further development of the "backplane" embodied the introduction of large, thicker printed wiring boards, with interconnecting circuits, to eliminate up to about 75% of wire wrap connections.

There are problems with this approach, for the posts from the connectors have to be soldered to the backplane, and mass wave soldering coats the connector posts with solder, thus making the subsequent wire wrap connections difficult and less reliable. Other mass soldering techniques cause severe warping of the entire backplane, due to high heat. This warpage creates severe reliability problems with the backplane connectors.

Attempts have been made to force-fit solid contact stems into the printed wiring backplane, through the holes previously used for soldered posts. This method works, but the printed-through holes have to be held to very close tolerances. Too large a hole gives a loose pin, with intermittent electrical contact, while a small hole is physically damaged by the tremendous force generated when the pin is forced in. Tight control of hole dimensions is effective, but costly.

One known connector provides a post that adjusts itself to various hole sizes. However it is violently overstressed when pressed into the plated hole, with reliability being about 98% good. The remaining 2% are good until thermal conditions create stress relaxation in the contact material and intermittent contact results (intermittency is the most troublesome fault). Another known compliant device operates like a spring "roll pin". This is effective but is costly to produce, and cannot be produced in close proximity to adjacent contacts, as much raw material is used to produce this device. Other known devices employ through slots in the center of the metal of the compliant section. Extension testing shows that this approach is even less reliable than the first one, unless one starts to again limit the hole size. Accordingly, there is need for a highly reliable compliant pin, making good contact with plating at all temperatures.

One solution to the above problems is disclosed in U.S. Pat. No. 4,223,970.

SUMMARY OF THE INVENTION

It is a major object of the invention to provide a contact or connector which will overcome the problems and difficulties described above, and which is characterized by high reliability, low cost, and descired compliance. In this regard, the invention improves over that of U.S. Pat. No. 4,223,970, as will be seen.

Basically, the connector is adapted to be pressed endwise into a hole in a circuit board, and comprises:

(a) an axially elongated pin having opposite outer surfaces operable to forcibly grip said structure at the boundary of the hole as the pin is inserted into the hole, the pin also having opposite outer sides, (b) the pin having first and second elongated grooves respectively sunk in said opposite sides thereof, the grooves extending axially of the pin and configured to locally weaken the pin so that at least one flexure is formed by the pin to extend axially thereof between and adjacent the groove and along the groove length, (c) the flexure adapted to yieldably flex in response to insertion of the pin into the hole and progressive gripping of said structure by said opposite outer surfaces, thereby to reduce the cross sectional area of that groove in response to insertion of the pin into the hole, (d) said opposite outer surfaces having convex curvature.

As will be seen, the flexure is typically centrally located between crests defined by the convexly curved opposite outer sides, and in such manner that a Z-shaped cross section is formed, with the flexure assuming an S-shaped flexed configuration, these two Z-shaped and S-shaped configurations contributing to maximum relative displacement of the convex outer surfaces, in use. Also, these S-shaped and Z-shaped configurations combine to define a spring that will return to its stamped shape on removal of compressive forces. When deflected inwardly, by such action, energy is stored in the spring members, developing outwardly opposing forces exerted by the convex outer surfaces against the walls of the hole. In application, the confining hole is plated in a backplane circuit board. Such holes typically have an electroplated layer of copper, and covering this, a layer of electroplated pin or tin/lead alloy.

When inserted into such a hole, the spring action of the contact section will create outwardly directed forces such that intimate electrical contact is made, over a wide area, while the pin is held firmly in its inserted location, such that subsequent operations-wire wrapping-logic board interconnection etc., do not dislodge the contact or disturb the intimate electrical connection. Also, the configuration of the contact enables its manufacture in a continuous strip, with very small spacing between adjacent contacts.

These and other objects and advantages of the invention, as well as the details of an illustrative embodiment, will be more fully understood from the following description and drawings, in which:

DRAWING DESCRIPTION

DETAILED DESCRIPTION

Figure 1:
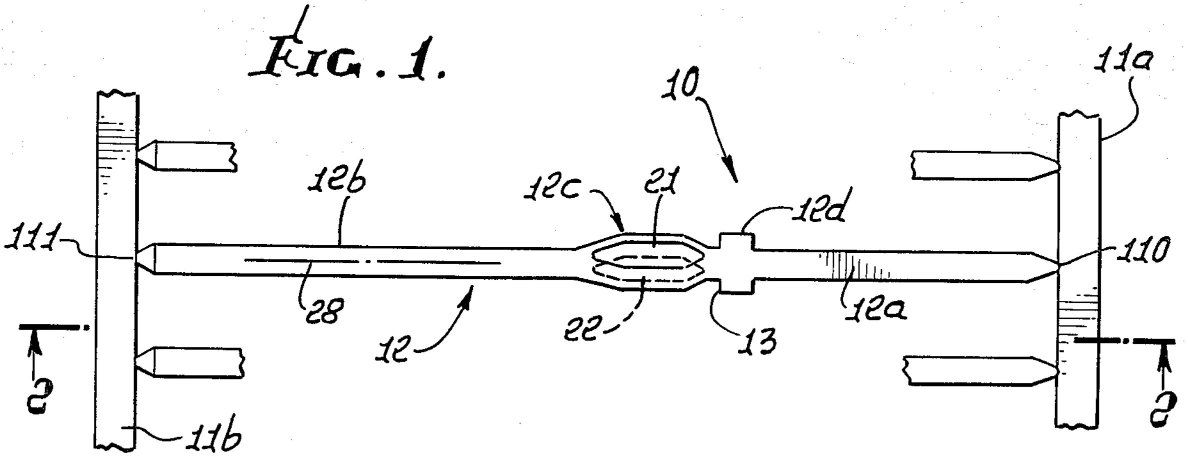
FIG. 1 is a plan view of a connector embodying the invention.
Figure 2:
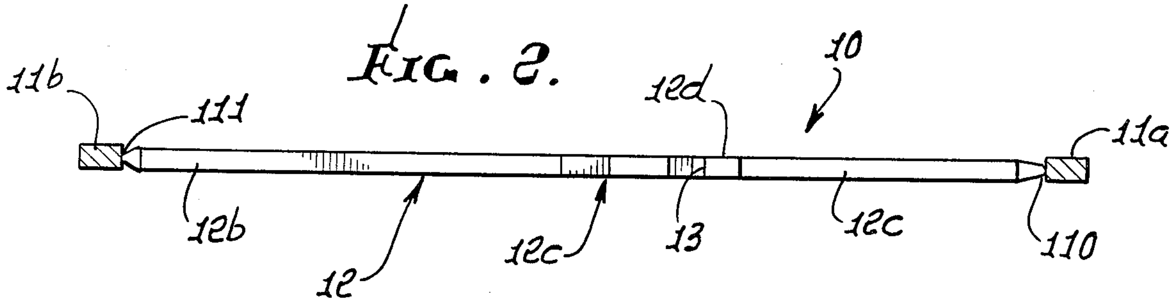
FIG. 2 is a side elevation taken on lines 2—2 of FIG. 1.

In FIGS. 1 and 2 the contact or connector 10 is shown to include an axially elongated flat pin 12. The latter includes a first section 12*a*, a wire-wrap post section 12*b*, and intermediate sections 12*c* and 12*d* joining the sections 12*a* and 12*b*. The latter are shown in FIG. 1 to have the same width, which is less than the width of section 12*c*. During stamped formation of the pin, its opposite ends may be joined to elongated strips 11*a* and 11*b*, as at break-off narrowed connections 110 and 111.

Figure 3:
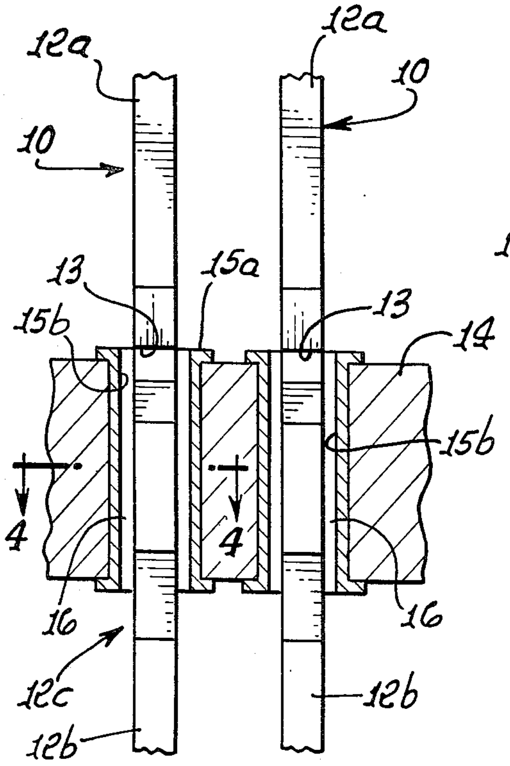
FIG. 3 is a vertical section showing a typical application of the FIG. 1 connector.

Step shoulder 13 formed at the junction of sections 12*c* and 12*d* is adapted to engage the printed circuit back plane board 14, or the plating 15*a* thereon, upon insertion of the connector into the board, thereby to limit such insertion. FIG. 3 shows two such connectors 10 inserted through openings or holes 16 the bores of which are plated at 15*b* with electrically conductive material.

Figure 4:
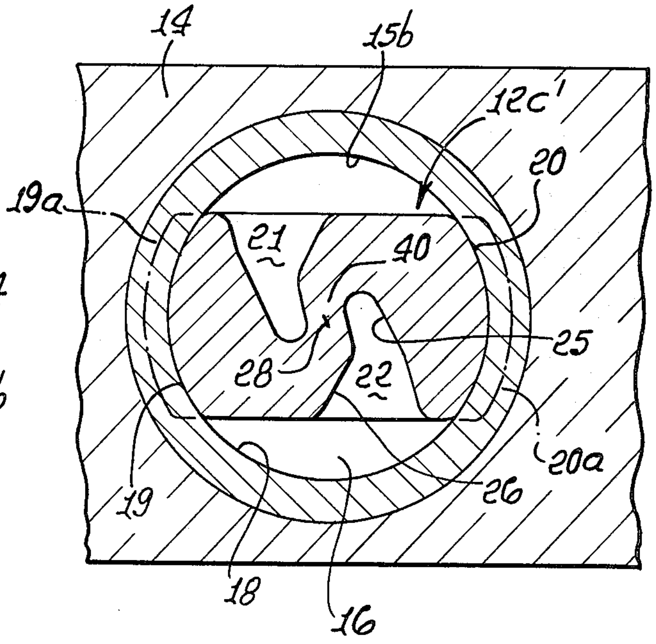
FIG. 4 is an enlarged section taken on lines 4—4 of FIG. 3.

In accordance with one aspect of the invention, the pin section 12*c* has opposite outer surfaces to forcibly grip the structure (as for example plating 15*b*) at the boundary of the hole as the pin is inserted into the hole. In the example shown in FIGS. 4-8, the pin section 12*c* has convex opposite outer surfaces 19 and 20 with curvature generally matching that of the circular bore 18. Such surfaces forcibly and frictionally grip the bore 18 of plating 15*b* upon insertion of the section 12*c* into the opening 16, and as will be explained, the cross section 12*c*′ yieldably reduces in lateral length so that the section end surfaces move from broken line positions 19*a* and 20*a* to the full line positions 19 and 20 indicated in FIG. 4. Note that the surfaces 19 and 20 distribute their grip loading over a large contact area, for assurance of good electrical contact and maintenance of the integrity of the bore wall 18, without scoring same.

Further, the pin has at least one elongated groove sunk in the side thereof, the groove extending axially of the pin and configured to locally weaken the pin so that at least one flexure is formed by the pin to extent axially thereof adjacent the groove and along the groove length. The flexure is adapted to yieldably flex in response to insertion of the pin into the hole, and in response to progressive gripping of the hole forming structure by the pin edges, thereby to reduce the cross sectional area of groove in response to insertion of the pin into the hole.

In the example, two such grooves 21 and 22 are sunk in opposite outer sides 23 and 24 respectively of section 12*c*, giving the cross section a Z-shape. Each groove has opposite side walls 25 and 26 forming generally V-shaped groove cross sections along major length extent of the groove, and in planes normal to the pin axis 28. Also, the bottoms of the grooves are concavely rounded as at 29. The depth of each groove is such as to accommodate relative movement of the walls 25 and 26 toward one another in response to insertion of the pin into the hole. Note in FIG. 4 that the full depth of each groove is greater than ½ the thickness of the section 12*c* between sides 23 and 24, but less than ¾ that thickness, for best results.

The flexure formed at 40 between the two grooves defines a plane 41 that extends at angle $\alpha$ relative to each side 23 and 24. That angle is between 45° and 75°, in unflexed condition of the flexure whereby maximum flexing and relative displacement of surfaces 19 and 20 are achieved. In flexed condition, as in FIG. 4, the flexure has S-shape, walls 25 are concave, and walls 26 are concave; whereas in FIG. 8, walls 25 and 26 are generally flat. The center of the flexure, i.e. at 28, lies mid way between crests 19*a*′ and 20*a*′ of surfaces 19 and 20.

Figure 5:
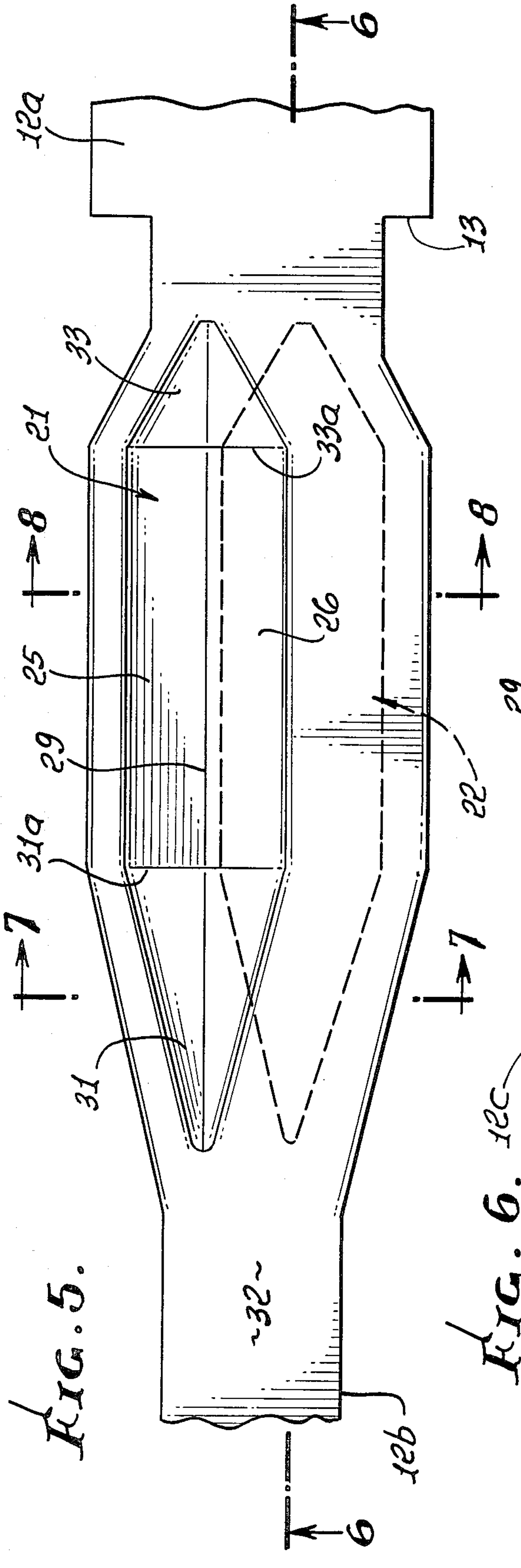
FIG. 5 is an enlarged fragmentary side view of the grooved portion of the FIG. 1 connector pin.
Figure 6:
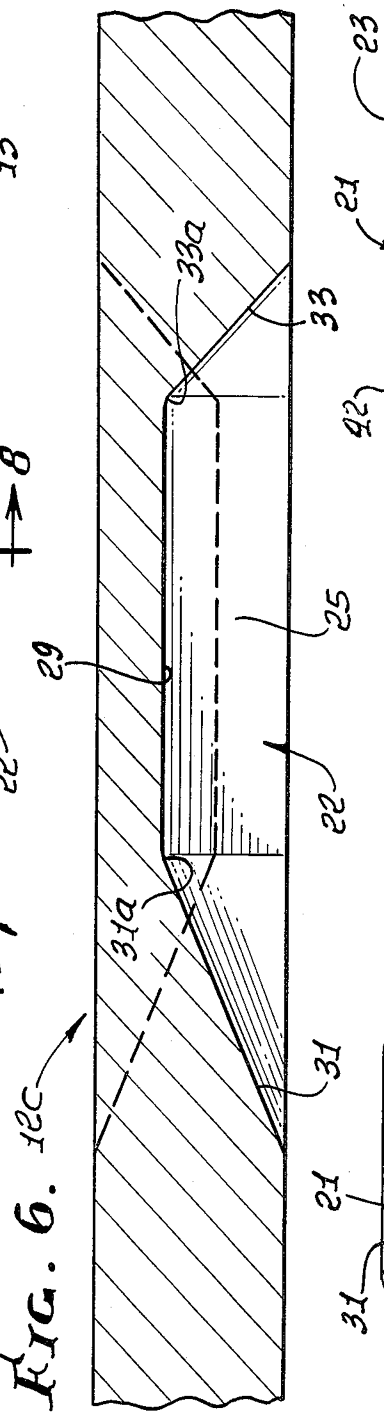
FIG. 6 is a section taken on lines 6—6 of FIG. 5.
Figure 8:
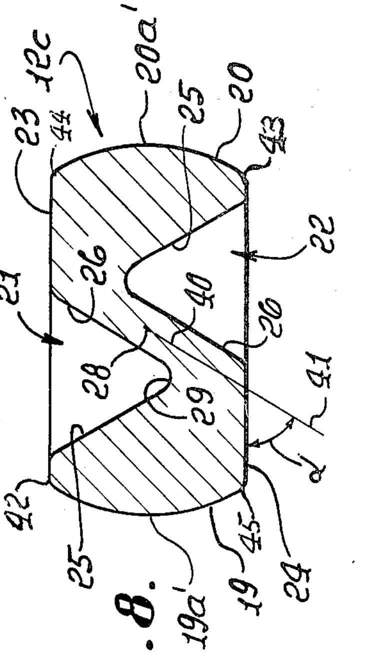
FIG. 8 is a section taken on lines 8—8 of FIG. 5.
Figure 7:
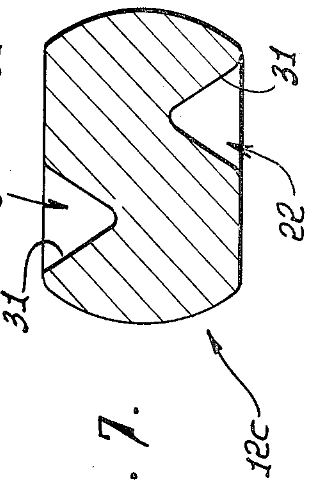
FIG. 7 is a section taken on lines 7—7 of FIG. 5.

FIGS. 5 and 7 show that the groove depth progressively increases along the generally triangular groove bottom wall 31 between the flat outer surface 32 and the full groove depth 29, at one end of the groove; likewise, at the opposite end of the groove, the depth progressively increases along the generally triangular groove botom wall 33 between the transverse plane of shoulder 13 and the full groove depth. These geometries are the same for both grooves 21 and 22. Walls 31 and 33 concavely merge at 31*a* and 33*a* with groove walls 25 and 26, for best results.

Ease of entry to prevent sudden disruption of a hole surface is thereby achieved in two ways with this design: the profile shape of the compliant section prevents gouging of the bore and distributes compression loading for good electrical contact, and the leading ends of the grooves making the bellows shape, are angled to allow deflection to occur progressively. In this regard, too obtuse an angle between groove walls 25 and 26 would overstress the metal during manufacture, and could cause fracture of the metal, while too sharp an angle would fail to develop forces that act throughout the length of the hole. Note also the concavely rounded edges at 42–45 between surfaces 19 and 20 and sides 23 and 24, which also prevent gouging of the bore 18.

Accordingly, the advantages described above, and also having to do with yieldable transverse contraction of the pin section 12*c* cross section (enabling progressive edge penetration of the plating material 15*b*) are most advantageously realized through the pin construction as described.

The spring action of the present design provides sufficient developed force to allow for, and compensate for, some loss of strength that occurs in any spring. Loss of strength is caused by heat and time, such losses being approximately the same for low heat/long time and for high heat/short time. Computers normally get hot, but are cooled by mechanical means to approximately to 50° C. At this temperature, 10 to 15% of a spring force is lost after 1,000 hours. Therefore, one must provide an initial surplus of force, so that there is still an adequate residual force over the lifetime of the product. Such stress relaxation is not linear, and is to some degree self limiting. The force/area ratio, (i.e. pressure) involved with this design is such that loss of 15% of the force gives only a very small drop in pressure.

We claim:

1. In a compliant electrical connector adapted to be pressed into a hole formed by surrounding structure, the combination comprising (a) an axially elongated pin having two opposite outer surfaces operable to forcibly grip said structure at the boundary of the hole as the pin is inserted into the hole, the pin also having opposite generally parallel outer sides, (b) the pin having first and second elongated grooves respectively sunk in said opposite sides thereof, the grooves extending axially of the pin and configured to locally weaken the pin so that at least one flexure is formed by the pin to extend axially thereof between and adjacent the grooves and along the groove length, (c) the flexure adapted to yieldably flex in response to insertion of the pin into the hole and progressive gripping of said structure by said opposite outer surfaces, thereby to reduce the cross sectional area of that groove in response to insertion of the pin into the hole, (d) said opposite outer surfaces having arcuately convex curvature throughout their extents and between more sharply rounded edge extents at which said opposite surfaces merge with said outer sides, (e) each groove having opposite side walls one of which is closest to the flexure and is convex toward the groove when the pin is pressed into the hole, the other side walls of the grooves convexly merging with said pin outer sides, respectively.

2. The connector of claim 1 wherein said flexure is centrally located between crests defined by the convexly curved opposite outer sides.

3. The connector of claim 2 wherein the flexure has a mid-portion located between said crests.

4. The connector of claim 1 wherein the depth of each groove progressively increases along one end portion of the groove, the pin having concave inner surfaces along the bottoms of said groove end portions.

5. The connector of claim 1 wherein the side walls of at least one groove form a generally V-shaped cross section along major extent of the groove and in planes normal to said axis, the depth of the groove accommodating relative movement of said walls toward one another in response to said insertion of the pin into said hole.

6. The connector of claim 1 including said structure forming said hole having bore extents into which the pin is received, the pin opposite outer surfaces compressivly interfitting said bore extends along convex extents of said surfaces.

7. The connector of claim 6 wherein said bore extents have substantially the same curvature as said pin outer surfaces.

8. The connector of claim 6 wherein the two grooves open outwardly at generally opposite sides of the pin, and said flexure extends in S-shaped flexed condition.

9. The connector of claim 8 wherein the depths of said grooves in the pin progressively increase along corresponding end portions of the two grooves, the pin having concave inner surfaces adjacent the bottoms of said groove end portions.

10. The connector of claim 4 wherein the side walls of each groove form a generally V-shaped cross section along major extent of each groove and in planes normal to said axis, the depths of the grooves accommodating relative movement of walls of each groove relatively toward one another in response to said insertion of the pin into the hole.

11. The connector of claim 10 wherein the pin has a Z-shaped cross section at the loci of said grooves.

12. The connector of claim 6 wherein said structure includes an electrically conductive plating material bounding said hole.

13. Multiple flat connectors as defined in claim 1, the opposite ends of the connectors removably attached to parallel strips and the connectors and strips defining a stamping.

14. In a compliant electrical connector adapted to be pressed into a hole formed by surrounding structure, the combination comprising (a) an axially elongated pin having two opposite outer surfaces operable to forcibly grip said structure at the boundary of the hole as the pin is inserted into the hole, the pin also having opposite generally parallel outer sides, (b) the pin having first and second elongated grooves respectively sunk in said opposite sides thereof, the grooves extending axially of the pin and configured to locally weaken the pin so that at least one flexure is formed by the pin to extend axially thereof between and adjacent the grooves and along the groove length, (c) the flexure adapted to yieldably flex in response to insertion of the pin into the hole and progressive gripping of said structure by said opposite outer surfaces, thereby to reduce the cross sectional area of that groove in response to insertion of the pin into the hole, (d) said opposite outer surfaces having arcuately convex curvature throughout their extents and between more sharply rounded edge extents at which said opposite surfaces merge with said outer sides, (e) each groove having opposite side walls one of which is closest to the flexure and convexly deflected toward the groove when the pin is sufficiently squeezed upon insertion into the hole, the other side walls of the grooves convexly merging with said pin outer sides, respectively.

* * * * *